(12) United States Patent
Pendharkar et al.

(10) Patent No.: US 6,624,481 B1
(45) Date of Patent: Sep. 23, 2003

(54) ESD ROBUST BIPOLAR TRANSISTOR WITH HIGH VARIABLE TRIGGER AND SUSTAINING VOLTAGES

(75) Inventors: Sameer P. Pendharkar, Richardson, TX (US); Philip L. Hower, Concord, MA (US); Robert Steinhoff, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/407,037

(22) Filed: Apr. 4, 2003

(51) Int. Cl.[7] .............................................. H01L 23/62
(52) U.S. Cl. ...................... 257/355; 257/362; 257/577
(58) Field of Search ................................. 257/355, 362, 257/363, 536, 566, 577

Primary Examiner—Mark V. Prenty
(74) Attorney, Agent, or Firm—Rose Alyssa Keagy; W. James Brady, III; Frederick J. Telecky, Jr.

(57) ABSTRACT

An ESD robust bipolar transistor (200) that includes first and second bipolar elements (210, 220), wherein a first trigger voltage of the first bipolar element (210) is proximate a second sustaining voltage of the second bipolar element (220). The first and second bipolar elements (210, 220) include first and second bases (214, 224), emitters (216, 226) and collectors (212, 222), respectively. The first and second bases (214, 224) are coupled and the first and second collectors (212, 222) are coupled. The ESD robust bipolar transistor (200) also includes an emitter resistor (250) and a base resistor (260), wherein the emitter resistor (250) couples the first and second emitters (216, 226) and the base resistor (260) couples the second emitter (226) and the first and second bases (214, 224).

20 Claims, 4 Drawing Sheets

ESD ROBUST BIPOLAR TRANSISTOR WITH HIGH VARIABLE TRIGGER AND SUSTAINING VOLTAGES

TECHNICAL FIELD OF THE INVENTION

The present invention is directed, in general, to bipolar transistors and, more specifically, to a dual-bipolar-element transistor having a diminished voltage snap-back.

BACKGROUND OF THE INVENTION

The electronic devices employed in paper media, automotive, digital audio, power management and many other applications include pinned components ranging from CMOS logic level up to 80 volts. However, output devices connected to high voltage pins are not always self-protecting. This presents the need for very high voltage, compact, ESD robust structures.

Typically, vertical npn-transistors play a key role in existing ESD solutions. Vertical npn-transistors better avoid current filamentation, and are generally more robust and smaller in size than alternative components. However, it is difficult to achieve the sustaining voltages required for many high voltage applications.

Those skilled in the art understand that most semiconductor bipolar devices, including bipolar transistors, experience a voltage snap-back. At low current the bipolar transistor exhibits a monotonically increasing I-V curve (voltage across the device increases as current through the device increase) until a "trigger" voltage is reached, at which time the transistor collector-to-emitter voltage reverts or "snaps-back" to a sustaining voltage. For devices with high trigger voltage, the sustaining voltage can be as much as 50 volts less than the trigger voltage. While it is known that the trigger voltage may be successfully increased to a desired value, existing bipolar devices are not capable of achieving a sustaining voltage much higher than 20 volts, which is much lower than required for many of the applications discussed above. Moreover, while some proposed solutions may achieve higher sustaining voltages, these devices are significantly larger than desired, and many times impractical.

Other designs that achieve a higher sustaining voltage involve stacking two or more low voltage devices. However, these designs are larger than desired and normally exhibit more variation in sustaining voltage. Specifically, additional isolation structure is required among the stacked devices. The overall variation in sustaining voltage of the stacked devices increases variation in device performance.

Accordingly, what is needed in the art is an ESD robust device that exhibits a diminished voltage snap-back. What is further desired is an ESD robust device that is compact and otherwise overcomes the above-discussed disadvantages of the prior art.

SUMMARY OF THE INVENTION

To address the above-discussed deficiencies of the prior art, the present invention provides an ESD robust bipolar transistor having first and second bipolar elements, wherein a first trigger voltage of the first bipolar element is proximate a second sustaining voltage of the second bipolar element. The first and second bipolar elements interact to transfer current therebetween. More specifically, at low current, the first bipolar element conducts most of the current. However, as current increases and the corresponding voltage approaches the first trigger voltage of the first bipolar element, an increasing portion of the current is transferred to the second bipolar element. As current continues to increase, it is primarily conducted by the second bipolar element at the second sustaining voltage of the second bipolar element.

Thus, the present invention introduces the concept of allowing current in an ESD robust device to continually increase without a significant change in voltage across the device. Accordingly, the ESD robust bipolar transistor of the present invention may be employed in applications requiring a high sustaining voltage, but is not as susceptible (if at all) to latch-up or other problems inherent to devices that exhibit a non-monotonic curve.

In one embodiment of the present invention, the first bipolar element includes a first base, a first emitter and a first collector, and the second bipolar element includes a second base, a second emitter and a second collector. The first base is coupled to the second base, and the first collector is coupled to the second collector. The transistor also includes an emitter resistor coupling the first and second emitters and a base resistor coupling the second emitter to the first and second bases. The emitter resistor operates to transfer current from the first bipolar element to the second bipolar element at a predetermined current or voltage. The base resistor operates to initiate injection from the emitter which helps modulate transistor conductivity. This helps reduce the difference between breakdown and trigger voltage. The base resistor also aids in the regulation of current sharing among the first and second bipolar devices.

In one embodiment, the first trigger voltage is above about 40 volts, although the present invention is not limited to bipolar transistor devices or elements having any particular trigger voltage. For example, the first trigger voltage may range between 5 volts and 80 volts.

In one embodiment, the proximity of the first trigger voltage and the second sustaining voltage may be about 5 volts. Of course, the present invention is not limited to a specific separation between the first trigger voltage and the second sustaining voltage. For example, in some embodiments the first trigger voltage and the second sustaining voltage may be the same. In other embodiments, the first trigger voltage may be up to 20 volts different than the second sustaining voltage. The first trigger voltage may also be less than or greater than the second sustaining voltage.

In one embodiment, the ESD robust bipolar transistor may be coupled in parallel to a circuit cell. In this manner, any voltage greater than the first trigger voltage may cause the ESD cell to activate and conduct high current until the ESD event ceases and the circuit cell may again continue operation.

The present invention also provides a method of manufacturing an ESD robust bipolar transistor. The method includes configuring a first bipolar element to have a first trigger voltage and configuring a second bipolar element to have a second sustaining voltage proximate the first trigger voltage. Those skilled in the art will understand that the method of the present invention may include additional manufacturing steps.

The present invention also provides an ESD robust bipolar transistor that includes a first bipolar element region formed in a first substrate and a second bipolar element region formed in a second substrate, wherein the first and second substrates may comprises portions of a common substrate. The first bipolar element region includes a first collector region located in the first substrate, a first base region located adjacent the first collector region, and a first emitter region located in the first base region. The second bipolar element region includes a second collector region located in the second substrate, a second base region located adjacent the second collector region, and a second emitter region located in the second base region. The ESD robust bipolar transistor also includes an emitter resistor coupling the first and second emitter regions and a base resistor coupling the second emitter region to the first and second base regions.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
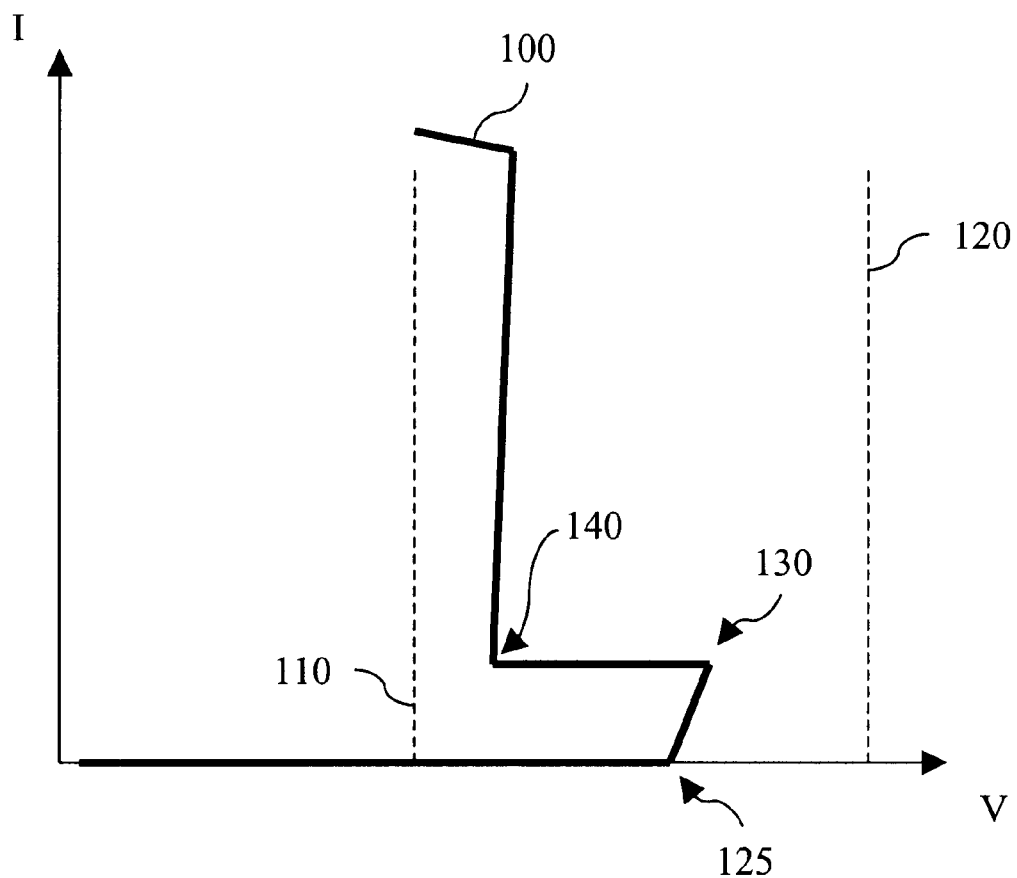
FIG. 1 illustrates an IV-curve for a conventional bipolar transistor.

As mentioned above, it is desirable to achieve an ESD robust device having a current-voltage relation (as demonstrated by an IV-curve) that is substantially vertical (current increases without significant increase in voltage), although most semiconductor bipolar devices experience snap-back, which is substantially non-vertical. For example, FIG. 1 illustrates an IV-curve 100 for a conventional bipolar transistor that may be employed in the ESD protection of a device. The dashed line 110 represents the nominal voltage of the signal transmitted by the device being protected. The dashed line 120 represents the voltage limit of the device being protected.

As shown in FIG. 1, when the voltage across the conventional bipolar transistor reaches a breakdown voltage at a point 125, current flow through the transistor begins to increase. Thereafter, when the voltage across the transistor reaches a trigger voltage at a point 130, the voltage "snaps back" to a sustaining voltage at a point 140. Those skilled in the art understand that this snap-back to a lower voltage value threatens proper operation of the transistor and the device being protected. For example, the snap-back behavior can cause latch-up in the device or circuit being protected or in other devices or circuits on the same substrate. Thus, it is desirable to achieve an ESD robust device that exhibits a substantially reduced snap-back behavior.

Figure 2:
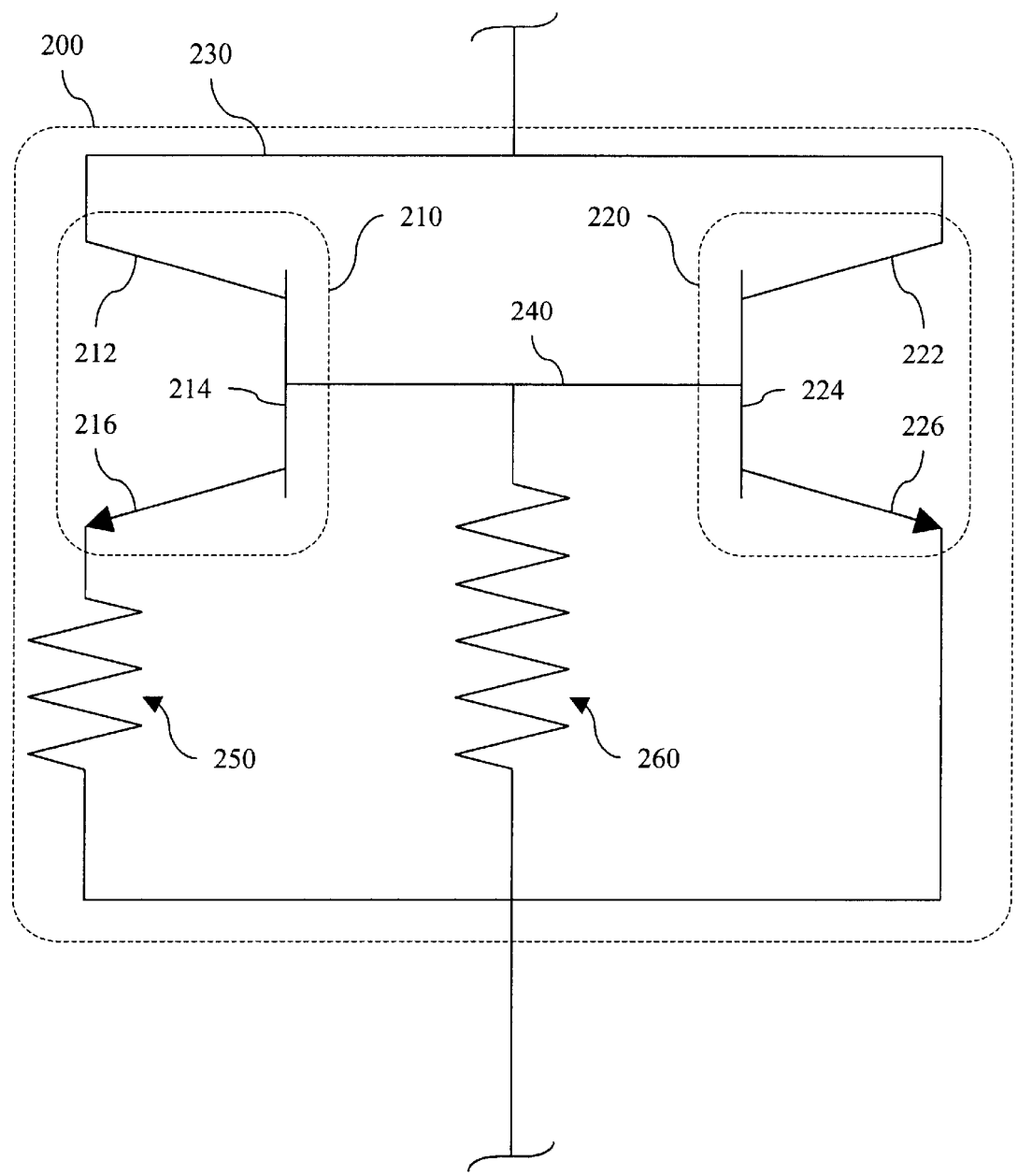
FIG. 2 illustrates a circuit diagram of an embodiment of an ESD robust bipolar transistor constructed according to the principles of the present invention.

Turning to FIG. 2, illustrated is a circuit diagram of an embodiment of an ESD robust bipolar transistor 200 constructed according to the principles of the present invention. The transistor 200 includes a first bipolar element 210 and a second bipolar element 220. The first and second bipolar elements 210, 220 may be conventional bipolar transistors, such as npn- or pnp-transistors. Accordingly, the first bipolar element 210 has a first trigger voltage, a first sustaining voltage and a first breakdown voltage and the second bipolar element 220 has a second trigger voltage, a second sustaining voltage and a second breakdown voltage. (The terms trigger, sustaining and breakdown voltages, as used herein, are described above with reference to FIG. 1.) Those skilled in the art understand how transistors such as the first and second bipolar elements 210, 220 may be designed to have particular trigger, sustaining and/or breakdown voltages by, e.g., tailoring doping profiles and altering physical locations of transistor such as buried and sinker layers (not shown), and altering physical locations and characteristics of other circuit elements, as described below.

The first bipolar element 210 includes a first collector 212, a first base 214 and a first emitter 216. Similarly, the second bipolar element 220 includes a second collector 222, a second base 224 and a second emitter 226. The first collector 212 is coupled to the second collector 222, and the first 214 base is coupled to the second base 224.

The transistor 200 also includes an emitter resistor 250 coupled between the first emitter 216 and the second emitter 226. The emitter resistor 250, which may be of conventional or later-developed composition and construction, is configured to allow operation of the first bipolar element 210 while the collector 230 current and/or voltage remains less than predetermined values. The emitter resistor 250 then helps transfer current to the second bipolar element 220 once the collector 230 current and/or voltage surpasses the predetermined values.

For example, the emitter resistor 250 may permit operation of the first bipolar element 210 while the collector 230 voltage remains close (slightly less or slightly more) to a first trigger voltage of the first bipolar element 210. However, when the collector 230 voltage falls more significantly below the first trigger voltage, the emitter resistor 250 causes most of the collector 230 current to be transferred to the second bipolar element 220.

In one embodiment, the emitter resistor 250 may be configured to optimize the minimum current through the second bipolar element 220 at the second sustaining voltage. Generally, the emitter resistor 250 may be sized such that the minimum current through the second bipolar element 220 at the second sustaining voltage may be proximate the current through the first bipolar element 210 at the first trigger voltage. In one embodiment, the emitter resistor 250 may have an ohmic value ranging between about 5Ω and about 50Ω. In a more specific embodiment, the emitter resistor 250 may have an ohmic value ranging between about 10Ω and about 15Ω. However, the present invention does not limit the emitter resistor 250 to any particular resistance value.

In one embodiment, the first trigger voltage may be about 40 volts or more. However, in other embodiments, the first trigger voltage may range between about 5 volts and about 80 volts. Moreover, those skilled in the art will recognize that the present invention does not limit the first trigger voltage to any particular value. However, in some embodiments, the first trigger voltage may be within about five volts of the second sustaining voltage of the second bipolar element 220. Furthermore, the first trigger voltage may be greater than or less than the second sustaining voltage.

The transistor 200 also includes a base resistor 260 coupled between the base 240 and the second emitter 226. Like the emitter resistor 250, the base resistor 260 may be a conventional or later-developed resistor, and its resistive value may vary from that of the emitter resistor 250. The base resistor 260 may be configured to initiate injection of carriers from the first and second emitters 216, 226, and to aid in the regulation of voltage and current sharing between the first and second bipolar elements 210, 220.

In one embodiment, the base resistor 260 may be configured to decrease the difference between the first breakdown voltage and the first trigger voltage. Generally, increasing the ohmic value of the base resistor 260 will decrease this difference. However, an over-sized base resistor 260 may undesirably reduce the first breakdown voltage. Thus, the base resistor may be sized to minimize the difference between the first breakdown voltage and the first trigger voltage without decreasing the first breakdown voltage. In one embodiment, the base resistor 260 may have an ohmic value ranging between about 1000Ω and about 2000Ω. In a more specific embodiment, the base resistor 260 may have an ohmic value ranging between about 1200Ω and about 1500Ω. However, the present invention does not limit the base resistor 260 to any particular resistance value.

Figure 3:
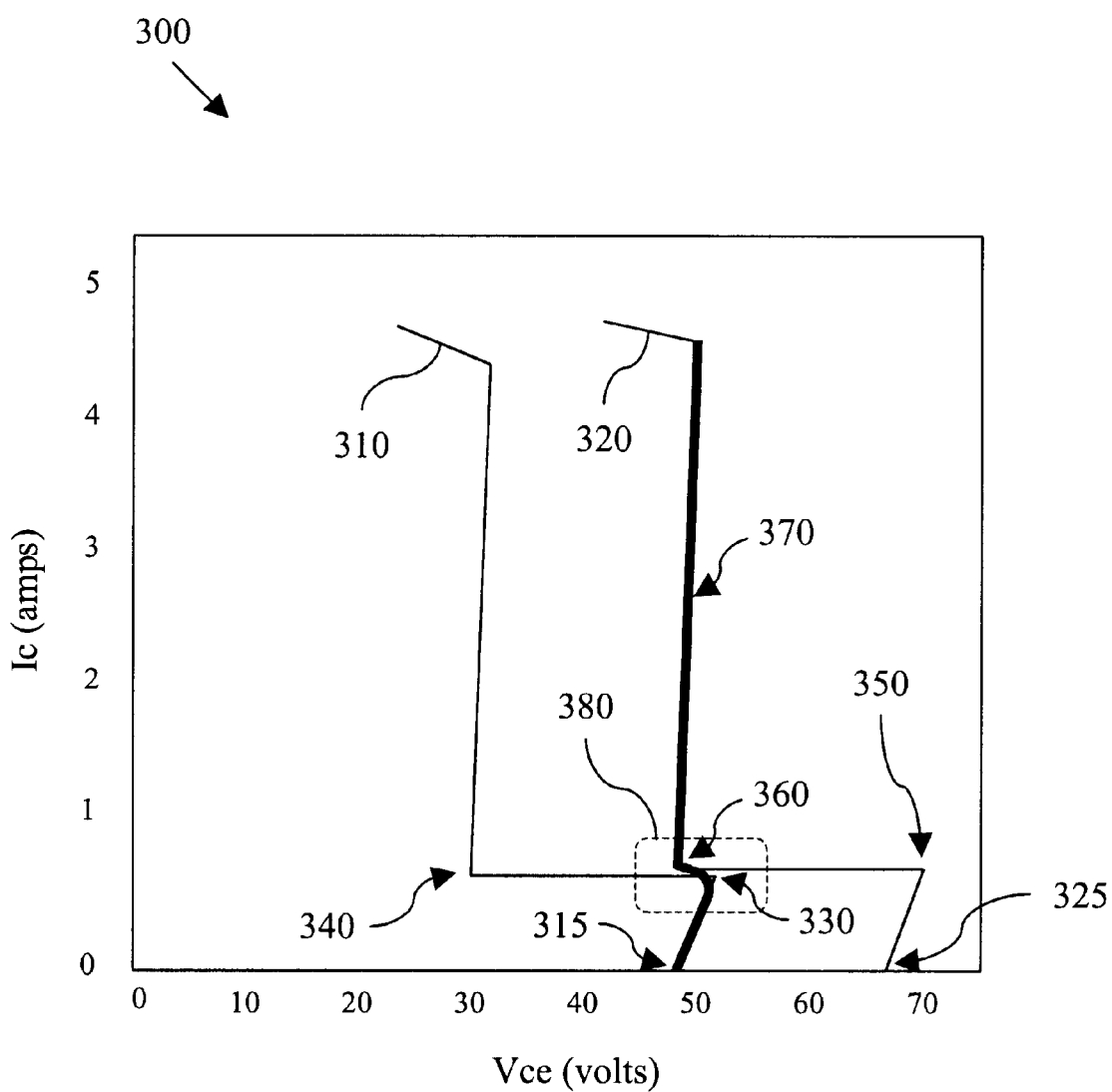
FIG. 3 illustrates an IV-curve of an embodiment of an ESD robust bipolar transistor constructed according to the principles of the present invention.

Turning now to FIG. 3, illustrated is an IV-curve 300 of an embodiment of an ESD robust bipolar transistor constructed according to the principles of the present application. The horizontal axis 302 relates the collector voltage of the ESD robust bipolar transistor, in units of volts, and the vertical axis 304 relates the current through the collector, in units of amps. In order to demonstrate the concept of the present invention, the IV-curve 300 includes a first curve 310 corresponding to a first bipolar element and a second curve 320 corresponding to a second bipolar element. The first and second bipolar elements represented in FIG. 3 may be at least similar to the first and second bipolar elements 210, 220, respectively, shown in FIG. 2. Accordingly, the first and second curves 310, 320 are referred to herein as the first and second bipolar element curves 310, 320, respectively.

As shown in FIG. 3, the first bipolar element curve 310 indicates a first breakdown voltage between about 45 volts and about 50 volts at a point 315, a first trigger voltage of about 50 volts at a point 330, and a first sustaining voltage of about 30 volts at a point 340. Similarly, the second bipolar element curve 320 indicates a second breakdown voltage between about 65 volts and about 70 volts at a point 325, a second trigger voltage of about 70 volts at a point 350, and a second sustaining voltage between about 45 volts and about 50 volts at a point 360. Of course, as discussed above, the present invention is not limited to the specific values shown in FIG. 3.

According to the principles of the present invention, the ESD robust bipolar transistor represented in FIG. 3 exhibits an IV-curve 370 (represented by a heavy, composite line) that is substantially vertical. By substantially vertical, it is intended that voltage remains within about five to about ten volts of an average voltage across the design spectrum of current values (in terms of amperes) seen by the ESD robust bipolar transistor.

As discussed above with reference to FIG. 2, the first bipolar element initially carries the low current, and thus the first bipolar element curve 310 is followed. As current increases, the collector voltage of the integrated ESD robust bipolar transistor approaches the first trigger voltage 330 of the first bipolar element. Current is transferred to the second bipolar element when the voltage across the ESD device is close to the first bipolar element trigger voltage 330. After this point, the second bipolar element curve 320 is followed. A broken line 380 in FIG. 3 illustrates this transition. As the collector current and voltage continue to increase, the second bipolar element primarily carries the current, and the IV-curve 370 of the ESD robust bipolar transistor follows the second sustaining voltage portion of the second bipolar element curve 320.

In this manner, the ESD robust bipolar transistor of the present invention does not experience the significant voltage snap-back exhibited by conventional transistors employed as voltage clamps or other ESD protection devices. Alternatively, the snap-back is less severe than with existing devices. Accordingly, the threat of latch-up is reduced or eliminated, and the ESD robust bipolar transistor exhibits a substantially vertical IV-curve (represented in FIG. 3 by the IV-curve 370).

Moreover, by integrating a first bipolar element having a moderate trigger voltage (e.g., the first trigger voltage 330) with a second bipolar element having a high sustaining voltage (e.g., the second sustaining voltage 360), an ESD robust bipolar transistor having a high sustaining voltage may be obtained in addition to achieving a substantially vertical current-voltage relation. Furthermore, those skilled in the art will recognize that the first and second bipolar elements may be configured to have predetermined trigger and sustaining voltages, and that the trigger and sustaining voltages may be selected on an application-specific basis.

Figure 4:
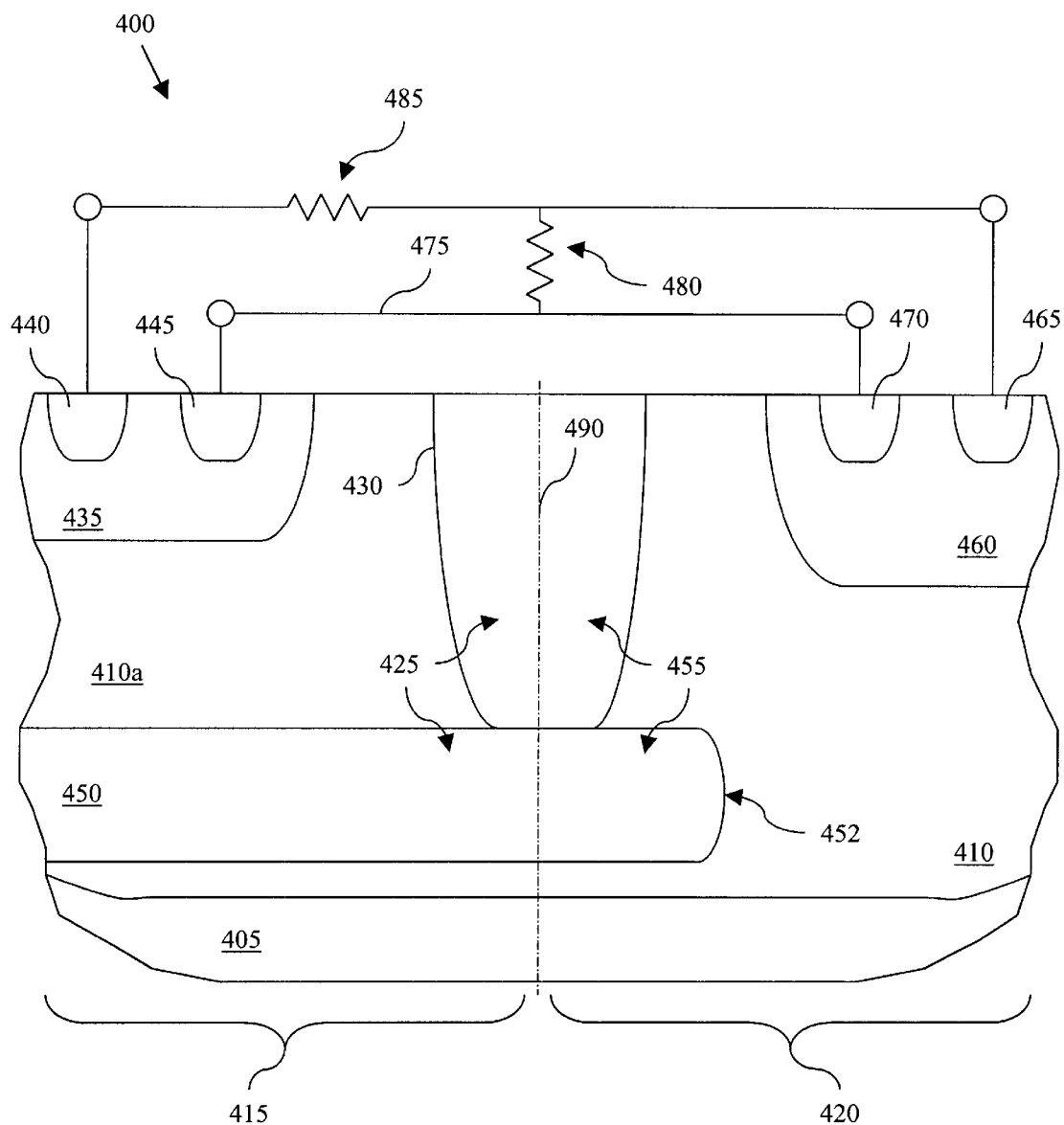
FIG. 4 illustrates a sectional view of an embodiment of an ESD robust bipolar transistor constructed according to the principles of the present invention.

Turning to FIG. 4 with continued reference to FIG. 2, illustrated is a sectional view of an embodiment of an ESD robust bipolar transistor 400 constructed according to the principles of the present invention. The ESD robust bipolar transistor 400 shown in FIG. 4 may be one embodiment of an implementation of the ESD robust bipolar transistor 200 shown in FIG. 2, and may exhibit an IV-curve that is at least similar to the IV-curve 300 shown in FIG. 3.

The ESD robust bipolar transistor 400 is formed in a substrate 405, which may be a p-doped substrate if the ESD robust bipolar transistor 400 is an npn-transistor device. However, those skilled in the art will recognize that the present invention is not limited to configuring the ESD robust bipolar transistor 400 as an npn-transistor device, and that the doping scheme described herein may be easily modified to configure the ESD robust bipolar transistor 400 as a pnp-transistor device. Moreover, those skilled in the art will understand that the bipolar features and doping schemes described herein may be achieved with conventional or later-developed lithographic processes.

The ESD robust bipolar transistor 400 also includes an n-doped or p-doped tub 410 formed in the substrate 405. A second tub 410a may be formed in or adjacent the first tub 410. In one embodiment, the first and second tubs 410, 410a may be oppositely doped (i.e., one p-doped tub and one n-doped tub). In another embodiment, the first and second tubs 410, 410a may be similarly or identically doped, such that only a single tub 410 may be employed.

A first bipolar element region 415 and a second bipolar element region 420 are located in the tubs 410a, 410, respectively. The first bipolar element region 415 includes a first collector region 425 formed by portions of an n-doped sinker layer 430 and an n-doped buried layer 450. A p-doped first base region 435 is formed in the first bipolar element region 415 and laterally spaced from the sinker layer 430. The first base region 435 includes an n-doped first emitter region 440, and may include a p-doped first base contact region 445. Because the first base region 435 and first collector region 425 are oppositely doped, and the tub 410a may be p-doped or n-doped, the first base region 435 may be formed integral to the tub 410a. Of course, it follows that, in other embodiments, the tub 410a may alternatively be formed integral to the first collector region 425.

The buried layer 450 laterally spans beneath all or a substantial portion of the first base region 435. A lateral endpoint 452 of the buried layer 450 may be proximate the center of the sinker layer 430. However, the exact location of the lateral endpoint 452 of the buried layer 450 is an application-specific matter of design. Those skilled in the pertinent art understand that the length of the buried layer 450 may be configured to achieve a desired trigger voltage of the composite bipolar element 400 and/or the bipolar elements formed in the first and second bipolar element regions 415, 420.

The second bipolar element region 420 includes a second collector region 455 formed by portions of the sinker layer 430 and buried layer 450. A p-doped second base region 460 is formed in the second bipolar element region 420 and laterally spaced from the sinker layer 430. The second base region 460 includes an n-doped second emitter region 465, and may include a p-doped second base contact region 470. Because the second base region 460 and second collector region 455 are oppositely doped, and the tub 410 may be p-doped or n-doped, the second base region 460 may be formed integral to the tub 410. Of course, it follows that, in other embodiments, the tub 410 may alternatively be formed integral to the second collector region 455.

The ESD robust bipolar transistor 400 also includes a base coupler 475 that electrically couples the first base region 435 and the second base region 460. The first base contact region 445 and the second base contact region 470 may facilitate such coupling. The base coupler 475 may be formed as part of a metallization layer (not shown) formed over the substrate 405. Of course, those skilled in the art will recognize that myriad other means exist for electrically coupling the first and second base regions 435, 460.

The ESD robust bipolar transistor 400 also includes a base resistor 480 electrically coupling the first and second base regions 435, 460 to the second emitter region 465 (via the base coupler 475). The base resistor 480 may comprise doped or un-doped polysilicon or other resistive materials. Those skilled in the art are familiar with the many configurations by which a resistor may couple elements in an integrated circuit, including those employed in the present invention.

The ESD robust bipolar transistor 400 also includes an emitter resistor 485 electrically coupling the first emitter region 440 to the base resistor 480, thereby electrically coupling the first emitter region 440 to the second emitter region 465. The emitter resistor 485 may be at least similar to the emitter resistor 250 shown in FIG. 2. As such, the emitter resistor 485 may be of conventional or later-developed composition and construction. For example, the emitter resistor 485 may comprise conventionally formed doped or undoped polysilicon or other resistive materials, and may be formed in a layer above the substrate 405. As discussed above with reference to FIG. 2, the emitter resistor 485 may be configured to transfer current from the first bipolar element region 415 to the second bipolar element region 420.

Those skilled in the art will recognize that the first collector region 425 (including portions of the sinker layer 430 and the buried layer 450), the first base region 435 and the first emitter region 440 may collectively form a first bipolar element in the first bipolar element region 415, and that the second collector region 455 (also including portions of the sinker layer 430 and the buried layer 450), the second base region 460 and the second emitter region 465 may collectively form a second bipolar element in the second bipolar element region 420, and that these first and second bipolar elements may be at least similar to the first and second bipolar elements 210, 220 shown in FIG. 2. Accordingly the first bipolar element formed in the first bipolar element region 415 may have a first breakdown voltage, a first trigger voltage and a first sustaining voltage, and the second bipolar element formed in the second bipolar element region 420 may have a second breakdown voltage, a second trigger voltage and a second sustaining voltage, wherein the second sustaining voltage is proximate the first trigger voltage. In this manner, the ESD robust bipolar transistor 400 may be compact yet still exhibit a substantially vertical IV-curve and achieve a sufficiently high sustaining voltage. Moreover, by altering the position of the sinker and buried layers 430, 450, and/or altering the resistance of the base resistor 480 and/or the emitter resistor 485, the first and second breakdown, trigger and sustaining voltages may be selected as a matter of design to meet the requirements of a specific application, including those requiring a sustaining voltage of 30 volts, 40 volts or more.

In the embodiment shown in FIG. 4, the first and second collector regions 425, 455 comprise portions of a single sinker layer 430 and a single buried layer 450. As such, the first and second collector regions 425, 455 are electrically coupled. However, while not illustrated as such, those skilled in the art will recognize that other embodiments of the ESD robust bipolar transistor of the present invention may include separate first and second collector regions. Taking this concept a step further, one embodiment of the ESD robust bipolar transistor of the present invention may include multiple substrates, such that the first and second bipolar element regions may each be formed in separate substrates.

For example, a first bipolar element region may be formed in a first substrate while a second bipolar element region may be formed in a second substrate. In such an embodiment, the first and second substrates may or may not be mechanically coupled to one another. However, first and second base regions may still be electrically coupled by a base conductor, first and second emitter regions may still be electrically coupled by an emitter resistor, first and second collector regions may still be electrically coupled by a conductor, and first and second base regions may still be electrically coupled to the second emitter region by a base resistor.

Although the present invention has been described in detail, those skilled in the art should understand that they can make various changes, substitutions and alterations herein without departing from the spirit and scope of the invention in its broadest form.

What is claimed is:

1. An ESD robust bipolar transistor, comprising:
   a first bipolar element having a first base, a first emitter, a first collector and a first trigger voltage;
   a second bipolar element having a second base, a second emitter, a second collector and a second sustaining voltage, said first base coupled to said second base, said first collector coupled to said second collector and said first trigger voltage proximate said second sustaining voltage;
   an emitter resistor coupling said first emitter and said second emitter; and a base resistor coupling said second emitter and said first and second bases.

2. The transistor as recited in claim 1 wherein said first trigger voltage is above about 40 volts.

3. The transistor as recited in claim 2 wherein said first trigger voltage is within about 5 volts of said second sustaining voltage.

4. The transistor as recited in claim 3 wherein said first trigger voltage is greater than said second sustaining voltage.

5. The transistor as recited in claim 1 wherein said base resistor is configured to minimize a difference between said first trigger voltage and a first breakdown voltage of said first bipolar element without reducing said first breakdown voltage.

6. A method of manufacturing an ESD robust bipolar transistor, comprising:

configuring a first bipolar element to have a first trigger voltage, said first bipolar element including a first base, a first emitter and a first collector;

configuring a second bipolar element to have a second sustaining voltage proximate said first trigger voltage, said second bipolar element including a second base, a second emitter and a second collector, said first base coupled to said second base and said first collector coupled to said second collector;

coupling an emitter resistor between said first emitter and said second emitter; and coupling a base resistor between said second emitter and said first and second bases.

7. The method as recited in claim 6 wherein said first trigger voltage is above about 40 volts.

8. The method as recited in claim 7 wherein said first trigger voltage is within about 5 volts of said second sustaining voltage.

9. The method as recited in claim 8 wherein said first trigger voltage is greater than said second sustaining voltage.

10. The method as recited in claim 6 wherein said base resistor is configured to minimize a difference between said first trigger voltage and a first breakdown voltage of said first bipolar element without reducing said first breakdown voltage.

11. An ESD robust bipolar transistor, comprising:

a first bipolar element region formed in a first substrate, said first bipolar element region having a first collector region located in said first substrate, a first base region located adjacent said first collector region, and a first emitter region located in said first base region;

a second bipolar element region formed in a second substrate, said second bipolar element region having a second collector region located in said second substrate, a second base region located adjacent said second collector region, and a second emitter region located in said second base region;

an emitter resistor coupling said first emitter region and said second emitter region; and a base resistor coupling said second emitter region and said first and second base regions.

12. The transistor as recited in claim 11 wherein said first and second substrates comprise portions of a common substrate.

13. The transistor as recited in claim 11 wherein said first and second collector regions comprise portions of a common collector region formed in at least one of said first and second substrates.

14. The transistor as recited in claim 11 wherein said emitter resistor is formed above said first and second substrates.

15. The transistor as recited in claim 11 wherein said base resistor is formed above said first and second substrates.

16. The transistor as recited in claim 11 wherein said first bipolar element region forms a first bipolar element having a first trigger voltage and said second bipolar element forms a second bipolar element having a second sustaining voltage proximate said first trigger voltage.

17. The transistor as recited in claim 16 further comprising a buried layer located beneath at least said first base and emitter regions and having a lateral endpoint, wherein said first and second substrates comprises portions of a common substrate, and wherein said second sustaining voltage is variable depending upon a proximity of said lateral endpoint to said second base region.

18. The transistor as recited in claim 16 wherein said first trigger voltage is above about 40 volts.

19. The transistor as recited in claim 18 wherein said first trigger voltage is within about 5 volts of said second sustaining voltage.

20. The transistor as recited in claim 16 wherein said base resistor is configured to minimize a difference between said first trigger voltage and a first breakdown voltage of said first bipolar element without reducing said first breakdown voltage.

* * * * *